US011496702B2

(12) United States Patent
Yamada et al.

(10) Patent No.: US 11,496,702 B2
(45) Date of Patent: *Nov. 8, 2022

(54) IMAGING DEVICE

(71) Applicant: Panasonic Intellectual Property Management Co., Ltd., Osaka (JP)

(72) Inventors: Takayoshi Yamada, Hyogo (JP); Yasuo Miyake, Osaka (JP); Masashi Murakami, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/202,060

(22) Filed: Mar. 15, 2021

(65) Prior Publication Data

US 2021/0203867 A1     Jul. 1, 2021

Related U.S. Application Data

(63) Continuation of application No. 16/255,679, filed on Jan. 23, 2019, now Pat. No. 10,979,658.

(30) Foreign Application Priority Data

Jan. 30, 2018   (JP) .............................. JP2018-013389

(51) Int. Cl.
   *H04N 5/363*      (2011.01)
   *H04N 5/378*      (2011.01)
   (Continued)

(52) U.S. Cl.
   CPC ....... *H04N 5/363* (2013.01); *H01L 27/14612* (2013.01); *H01L 27/14665* (2013.01);
   (Continued)

(58) Field of Classification Search
   CPC ........ H04N 5/363; H04N 5/351; H04N 5/353; H04N 5/3575; H04N 5/374;
   (Continued)

(56) References Cited

U.S. PATENT DOCUMENTS

| 7,750,958 B1 | 7/2010 | Dierickx |
| 2003/0011694 A1 | 1/2003 | Dierickx |

(Continued)

FOREIGN PATENT DOCUMENTS

| CN | 205159324 U | 4/2016 |
| CN | 105742303 A | 7/2016 |

(Continued)

OTHER PUBLICATIONS

Non-Final Office Action issued in U.S. Appl. No. 16/255,679, dated Aug. 20, 2019.

(Continued)

*Primary Examiner* — Jason A Flohre
(74) *Attorney, Agent, or Firm* — McDermott Will & Emery LLP

(57) ABSTRACT

An imaging device including a photoelectric converter that converts incident light into an electric charge; a transfer transistor; a first node coupled to the photoelectric converter via the transfer transistor; a first signal detection transistor having a gate coupled to the first node; a second signal detection transistor having a gate coupled to the photoelectric converter; a signal line coupled to one of a source and a drain of the first signal detection transistor; a first transistor coupled to the first node; and a second transistor coupled to the photoelectric converter, wherein one of the source and the drain of the first signal detection transistor is coupled to the first transistor, one of a source and a drain of the second signal detection transistor is coupled to the second transistor, (Continued)

and no transistor is coupled between the photoelectric converter and the gate of the second signal detection transistor.

17 Claims, 10 Drawing Sheets

(51) Int. Cl.
    *H04N 5/351*    (2011.01)
    *H01L 27/146*    (2006.01)
    *H04N 5/3745*    (2011.01)
    *H04N 5/357*    (2011.01)
    *H04N 5/353*    (2011.01)
    *H04N 5/374*    (2011.01)

(52) U.S. Cl.
    CPC ............. *H04N 5/351* (2013.01); *H04N 5/353* (2013.01); *H04N 5/3575* (2013.01); *H04N 5/374* (2013.01); *H04N 5/378* (2013.01); *H04N 5/37452* (2013.01)

(58) Field of Classification Search
    CPC .... H04N 5/37452; H04N 5/378; H04N 5/357; H04N 5/369; H01L 27/14612; H01L 27/14665
    See application file for complete search history.

(56) References Cited

U.S. PATENT DOCUMENTS

| | | |
|---|---|---|
| 2004/0239781 A1 | 12/2004 | Harada et al. |
| 2005/0040320 A1 | 2/2005 | Lule et al. |
| 2007/0153109 A1* | 7/2007 | Lule ...................... H04N 5/343 348/E3.019 |
| 2008/0210886 A1 | 9/2008 | Mauritzson |
| 2008/0268050 A1 | 10/2008 | Gerrish et al. |
| 2012/0059625 A1* | 3/2012 | Kim ........................ G01S 17/89 702/159 |
| 2013/0308023 A1 | 11/2013 | Sugawa et al. |
| 2014/0131554 A1 | 5/2014 | Ishii et al. |
| 2014/0263950 A1 | 9/2014 | Fenigstein et al. |
| 2015/0264273 A1 | 9/2015 | Feder et al. |
| 2016/0150174 A1 | 5/2016 | Hynecek |
| 2016/0190187 A1 | 6/2016 | Nishimura et al. |
| 2016/0190188 A1 | 6/2016 | Murakami et al. |
| 2016/0360131 A1 | 12/2016 | Shimasaki et al. |
| 2016/0360132 A1 | 12/2016 | Kanehara |
| 2017/0170223 A1 | 6/2017 | Hynecek et al. |
| 2017/0214871 A1 | 7/2017 | Kanehara et al. |
| 2017/0295333 A1 | 10/2017 | Geurts |
| 2019/0104263 A1 | 4/2019 | Shirini et al. |

FOREIGN PATENT DOCUMENTS

| | | |
|---|---|---|
| JP | 2004-048553 A | 2/2004 |
| JP | 2004-511183 A | 4/2004 |
| JP | 2012-165193 A | 8/2012 |
| WO | 2002/030101 A1 | 4/2002 |
| WO | 2013/018293 A1 | 2/2013 |
| WO | 2017/135693 A1 | 8/2017 |

OTHER PUBLICATIONS

Final Office Action issued in U.S. Appl. No. 16/255,679, dated Mar. 3, 2020.
Non-Final Office Action issued in U.S. Appl. No. 16/255,679, dated Jul. 16, 2020.
Notice of Allowance issued in U.S. Appl. No. 16/255,679, dated Dec. 12, 2020.
English Translation of Chinese Search Report dated Jul. 11, 2022 for the related Chinese Patent Application No. 201811485438.8.

* cited by examiner

IMAGING DEVICE

This application is a Continuation Application of U.S. patent application Ser. No. 16/255,679, filed on Jan. 23, 2019, which claims the benefit of Japanese Application No. 2018-013389, filed on Jan. 30, 2018, the disclosures of which are incorporated herein by reference.

BACKGROUND

1. Technical Field

The present disclosure relates to an imaging device.

2. Description of the Related Art

An image sensor that utilizes photoelectric conversion is widely used for an imaging device such as a digital camera. Typically, rolling shutter, which is a method of sequentially performing exposure and readout of a signal electric charge for each row of a pixel array, is employed as a signal readout method.

In rolling shutter, the start and end of exposure differ from one row to another of a pixel array. Accordingly, a distorted image of an object is sometimes obtained in a case where an image of an object that moves at a high speed is taken. Furthermore, in a case where an image is taken while using a flashlight, a difference in brightness sometimes occur within the image. Furthermore, in a case where an object that blinks on and off at a high speed is captured, a plurality of images in each of which light of the object is on or a plurality of images in each of which light of the object is off are sometimes obtained depending on a frame rate. In view of such circumstances, there are demands for a global shutter function in which the start and end of exposure are common to all pixels in a pixel array.

For example, U.S. Patent Application Publication No. 2008/0210986 discloses an imaging device in which a global shutter operation can be performed. FIGS. 1 and 2 of U.S. Patent Application Publication No. 2008/0210986 disclose a circuit configuration in which a transfer transistor is interposed between a photodiode and a floating diffusion region.

SUMMARY

It is beneficial if a global shutter function can be realized while reducing influence of noise. It is more beneficial if a frame rate can be improved.

One non-limiting and exemplary embodiment provides the following.

In one general aspect, the techniques disclosed here feature an imaging device including a photoelectric converter that converts incident light into an electric charge; a transfer transistor; a first node coupled to the photoelectric converter via the transfer transistor; a first signal detection transistor having a gate coupled to the first node; a second signal detection transistor having a gate coupled to the photoelectric converter; a signal line coupled to one of a source and a drain of the first signal detection transistor but not through either a gate or the other of the source and the drain of the first signal detection transistor, a signal corresponding to an electric potential of the first node being transmitted through the signal line; a first transistor one of a source and a drain of which is coupled to the first node; and a second transistor one of a source and a drain of which is coupled to the photoelectric converter, wherein the one of the source and the drain of the first signal detection transistor is coupled to the other of the source and drain of the first transistor but not through either the gate or the other of the source and the drain of the first signal detection transistor, one of a source and a drain of the second signal detection transistor is coupled to the other of the source and drain of the second transistor, and no transistor is coupled between the photoelectric converter and the gate of the second signal detection transistor.

It should be noted that general or specific embodiments may be implemented as an element, a device, a system, an integrated circuit, a method, a computer program, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
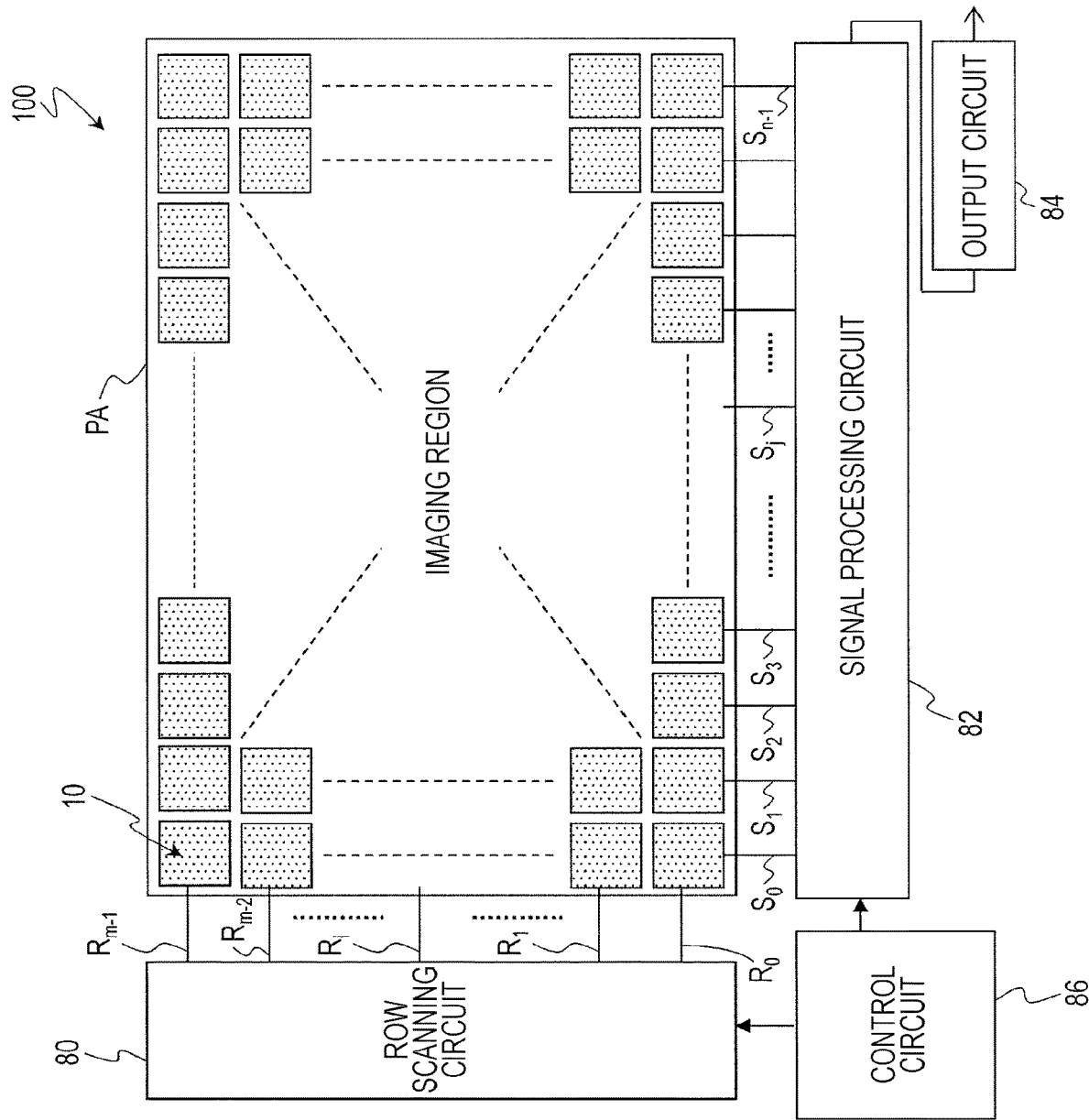
FIG. 1 schematically illustrates an exemplary configuration of an imaging device according to an embodiment of the present disclosure.

An outline of an aspect of the present disclosure is as follows.

Item 1

An imaging device including:
a photoelectric converter that converts light into an electric charge;
a transfer transistor;
a charge accumulation node coupled to the photoelectric converter via the transfer transistor;
a first signal detection transistor having a gate coupled to the charge accumulation node;
a first reset transistor one of a source and a drain of which is coupled to the charge accumulation node; and
a second reset transistor one of a source and a drain of which is coupled to the photoelectric converter, wherein
one of a source and a drain of the first signal detection transistor is coupled to the other of the source and the drain of the first reset transistor and the other of the source and drain of the second reset transistor.

Item 2

The imaging device according to Item 1, wherein at least a part of a signal output by the first signal detection transistor is fed back to the other of the source and drain of the first reset transistor and the other of the source and drain of the second reset transistor.

Item 3

An imaging device including:
a photoelectric converter that converts incident light into an electric charge;
a transfer transistor;
a charge accumulation node coupled to the photoelectric converter via the transfer transistor;
a first signal detection transistor having a gate coupled to the charge accumulation node;
a second signal detection transistor having a gate coupled to the photoelectric converter;
a first reset transistor one of a source and a drain of which is coupled to the charge accumulation node; and
a second reset transistor one of a source and a drain of which is coupled to the photoelectric converter, wherein
one of a source and a drain of the first signal detection transistor is coupled to the other of the source and drain of the first reset transistor; and
one of a source and a drain of the second signal detection transistor is coupled to the other of the source and drain of the second reset transistor.

Item 4

The imaging device according to Item 3, wherein
at least a part of a signal output by the first signal detection transistor is fed back to the other of the source and drain of the first reset transistor; and
at least a part of a signal output by the second signal detection transistor is fed back to the other of the source and drain of the second reset transistor.

Item 5

The imaging device according to any one of Items 1 through 4, further including:
a feedback transistor coupled between the one of the source and the drain of the first signal detection transistor and the other of the source and drain of the first reset transistor;
a first capacitor having a first end and a second end, the first end being coupled to the charge accumulation node, the second end being coupled to the other of the source and drain of the first reset transistor; and
a second capacitor having a third end and a fourth end, the third end being coupled to a node between the first reset transistor and the feedback transistor.

Item 6

The imaging device according to one of Items 1 through 4, further including:
a feedback transistor one of a source and a drain of which is coupled to the one of the source and drain of the first signal detection transistor;
a first capacitor having a first end and a second end, the first end being coupled to the charge accumulation node, the second end being coupled to the other of the source and drain of the feedback transistor; and
a second capacitor having a third end and a fourth end, the third end being coupled to a node between the feedback transistor and the first capacitor.

Item 7

The imaging device according to any one of Items 1 through 6, further including a buffer circuit coupled between the transfer transistor and the one of the source and the drain of the second reset transistor.

Item 8

An imaging device including:
a photoelectric converter that converts incident light into an electric charge;
a transfer transistor;
a charge accumulation node coupled to the photoelectric converter via the transfer transistor;
a first signal detection transistor that outputs a signal corresponding to an amount of electric charge accumulated in the charge accumulation node; and
a feedback circuit that electrically feeds back output of the first signal detection transistor, wherein
the feedback circuit includes:
a first reset transistor that resets the charge accumulation node, one of a source and a drain of the first reset transistor being coupled to the charge accumulation node, and
a second reset transistor that resets the photoelectric converter, one of a source and a drain of the second reset transistor being coupled to the photoelectric converter; and
the whole or part of the signal is electrically fed back to the other of the source and drain of the first reset transistor and the other of the source and drain of the second reset transistor.

According to the configuration of Item 8, the charge accumulation node is coupled to the photoelectric converter via the transfer transistor. This makes it possible to read out a signal corresponding to an electric potential of the charge accumulation node in parallel with accumulation of a signal electric charge in a node coupled to the photoelectric converter. For example, it is therefore possible to shorten a period that does not contribute to accumulation of an electric charge and improve a frame rate. In particular, global shutter can be realized by turning the second reset transistor and the transfer transistor off at the same timing in all pixels. Furthermore, output of the first signal detection transistor can be used for reset of the charge accumulation node and the photoelectric converter, and influence of noise can be reduced by noise cancelling utilizing feedback.

Item 9

An imaging device including:
a photoelectric converter that converts incident light into an electric charge;
a transfer transistor;
a charge accumulation node coupled to the photoelectric converter via the transfer transistor;
a first signal detection transistor that outputs a first signal corresponding to an amount of electric charge accumulated in the charge accumulation node;
a second signal detection transistor that outputs a second signal corresponding to an amount of electric charge accumulated in a node between the photoelectric converter and the transfer transistor; and
a feedback circuit that electrically feeds back output of the first signal detection transistor and output of the second signal detection transistor, wherein
the feedback circuit includes:
a first reset transistor that resets the charge accumulation node, one of a source and a drain of the first reset transistor being coupled to the charge accumulation node, and a second reset transistor that resets the photoelectric converter, one of a source and a drain of the second reset transistor being coupled to the photoelectric converter; and the whole or part of the first signal is electrically fed back to the other of the source and drain of the first reset transistor, and the whole or part of the second signal is electrically fed back to the other of the source and drain of the second reset transistor.

According to the configuration of Item 9, effects similar to the configuration of Item 8 are obtained. Furthermore, an initialization circuit including a signal detection circuit is coupled to the charge accumulation node and the photoelectric converter, and therefore formation and cancellation of a feedback loop can be controlled independently for the charge accumulation node and the photoelectric converter, and reset and noise cancelling on the charge accumulation node and reset and noise cancelling on the photoelectric converter can be executed in parallel.

Item 10

The imaging device according to Item 8 or 9, further including a feedback transistor that is coupled between one of a source and a drain of the first signal detection transistor and the other of the source and drain of the first reset transistor;

a first capacitor that is coupled in parallel with the first reset transistor; and a second capacitor, one of electrodes of the second capacitor being coupled to a node between the feedback transistor and the other of the source and drain of the first reset transistor.

According to the configuration of Item 10, the first reset transistor can function as a transistor for gain switching. By appropriately controlling a gate voltage of the first reset transistor and a gate voltage of the feedback transistor, a first mode in which imaging can be executed at relatively high sensitivity and a second mode suitable for imaging under high illuminance in which imaging can be executed at relatively low sensitivity can be switched.

Item 11

The imaging device according to Item 8 or 9, further including a feedback transistor that is coupled between one of a source and a drain of the first signal detection transistor and the charge accumulation node;

a first capacitor that is coupled between the feedback transistor and the charge accumulation node; and a second capacitor, one of electrodes of the second capacitor being coupled to a node between the feedback transistor and the first capacitor, wherein the other of the source and drain of the first reset transistor is coupled to the one of the source and drain of the first signal detection transistor.

According to the configuration of Item 11, one of the source and drain of the first reset transistor that is not coupled to the charge accumulation node is coupled to one of the source and drain of the first signal detection transistor. This makes it possible to improve flexibility of design of an impurity profile for securing driving force of the first reset transistor.

Item 12

The imaging device according to any one of Items 8 through 11, further including a buffer circuit coupled between the transfer transistor and the one of the source and the drain of the second reset transistor.

According to the configuration of Item 12, an S/N ratio can be improved by interposing the buffer circuit between the transfer transistor and the second reset transistor. As a result, influence of noise can be made relatively small.

An embodiment of the present disclosure is described in detail below with reference to the drawings. An embodiment described below is a specific example of the present disclosure. Numerical values, shapes, materials, constituent elements, the way in which the constituent elements are disposed and coupled, steps, the order of steps, and the like are examples and do not limit the present disclosure. Various aspects described in the subject specification can be combined as long as no contradiction occurs. Among constituent elements in the embodiment below, constituent elements that are not described in independent claims indicating highest concepts are described as optional constituent elements. In the following description, constituent elements having a substantially identical function are given an identical reference sign, and description thereof is sometimes omitted.

Embodiment of Imaging Device

FIG. 1 illustrates an exemplary configuration of an imaging device according to an embodiment of the present disclosure. An imaging device 100 illustrated in FIG. 1 includes a pixel array PA including a plurality of pixels 10 and peripheral circuits. Each of the pixels 10 has a photoelectric converter that converts incident light into an electric charge, and the plurality of pixels 10 are, for example, arranged two-dimensionally on a semiconductor substrate to form an imaging region. In this example, the pixels 10 are arranged in a matrix of m rows and n columns, and a center of each of the pixels 10 is located at a grid point of a square grid. A way in which the pixels 10 are arranged is not limited to the example illustrated in FIG. 1, and the plurality of pixels 10 may be arranged so that a center of each of the pixels 10 is located at a grid point of a triangular grid, a hexagonal grid, or the like.

In the configuration illustrated in FIG. 1, the peripheral circuits include a row scanning circuit 80, a signal processing circuit 82, an output circuit 84, and a control circuit 86. The peripheral circuits may be disposed on the semiconductor substrate on which the pixel array PA is provided. A part of the peripheral circuits may be disposed on another substrate.

The row scanning circuit 80 is also called a vertical scanning circuit and is coupled to row control lines $R_0$, $R_1$, ... $R_i$, ..., and $R_{m-1}$ that are provided corresponding to the respective rows of the plurality of pixels 10. For example, a row control line $R_i$ is coupled to a plurality of pixels 10 belonging to an i-th row among the plurality of pixels 10, and the row scanning circuit 80 is coupled to these pixels through the row control line $R_i$. The row scanning circuit 80 selects pixels 10 per row and reads out a signal voltage and resets a photoelectric converter within each of the pixels 10.

FIG. 1 merely schematically illustrates connection between each of the pixels 10 and the row scanning circuit 80, and the number of control lines disposed for each row of the plurality of pixels 10 is not limited to one. As described later, the imaging device 100 may have two or more control lines for each row. For example, the row scanning circuit 80 may also be coupled to reset control lines or the like provided corresponding to the respective rows of the plurality of pixels 10.

The signal processing circuit 82 is coupled to output signal lines $S_0$, $S_1$, ..., $S_j$, ..., and $S_{n-1}$ provided corresponding to the respective columns of the plurality of pixels 10. For example, a plurality of pixels 10 belonging to a j-th column are coupled to the output signal line $S_j$. Output of the pixels 10, which are selected per row by the row scanning circuit 80, is read out to the signal processing circuit 82 through the output signal lines $S_0$ through $S_{n-1}$. The signal processing circuit 82 performs processing such as noise suppression signal processing represented by correlated double sampling and analog-digital conversion on output signals read out from the pixels 10. Output of the signal processing circuit 82 is read out to an outside of the imaging device 100 via the output circuit 84.

The control circuit 86 receives, for example, command data, a clock, or the like given from an outside of the imaging device 100 and controls the whole imaging device 100. The control circuit 86 typically has a timing generator and supplies a drive signal, for example, to the row scanning circuit 80 and the signal processing circuit 82.

Figure 2:
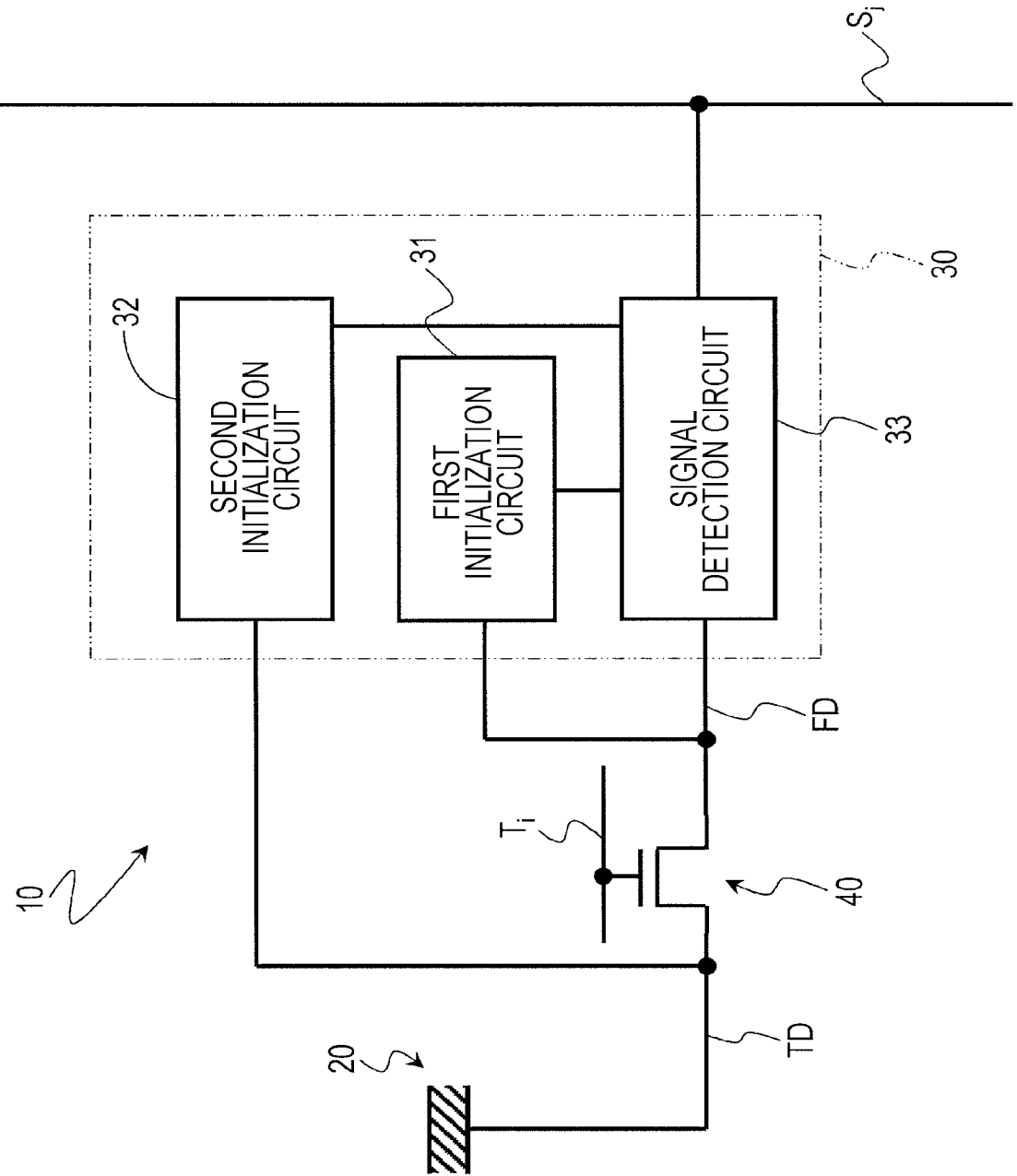
FIG. 2 schematically illustrates an outline of a circuit configuration of a pixel.

FIG. 2 schematically illustrates an outline of a circuit configuration of each of the pixels 10. For simplification of description, FIG. 2 illustrates a pixel 10 located in the i-th row and the j-th column of the pixel array PA.

The pixel 10 schematically includes a photoelectric converter 20, a charge accumulation node FD coupled to the photoelectric converter 20, a transfer transistor 40 coupled between the photoelectric converter 20 and the charge accumulation node FD, and a feedback circuit 30. The feedback circuit 30 includes a signal detection circuit 33, and a first initialization circuit 31 and a second initialization circuit 32 that are coupled to the signal detection circuit 33. The first initialization circuit 31 is coupled to the charge accumulation node FD and resets an electric potential of the charge accumulation node FD to a predetermined electric potential. Meanwhile, the second initialization circuit 32 is coupled to a node TD between the photoelectric converter 20 and the transfer transistor 40 and resets an electric potential of the node TD, i.e., an electric potential of the photoelectric converter 20 to a predetermined electric potential.

The photoelectric converter 20 converts incident light into an electric charge. Typically, a pair of positive and negative electric charges is generated in the photoelectric converter 20 by incident light, and an electric charge of one polarity is temporarily accumulated in the node TD as a signal electric charge. The following describes an example in which the signal electric charge is a hole. As described later, for example, a photodiode or a photoelectric conversion structure in which a photoelectric conversion layer is sandwiched between two electrodes can be applied as the photoelectric converter 20. A specific example of the photoelectric conversion structure will be described later.

As illustrated in FIG. 2, the pixel 10 further includes the transfer transistor 40 coupled between the photoelectric converter 20 and the charge accumulation node FD. The transfer transistor 40 is typically a field-effect transistor, and a transfer control line $T_i$ is coupled to a gate of the transfer transistor 40. The transfer control line $T_i$ is coupled, for example, to the row scanning circuit 80, and the row scanning circuit 80 switches the transfer transistor 40 on and off by controlling an electric potential of the transfer control line $T_i$.

When the transfer transistor 40 is turned on, a signal electric charge accumulated in the node TD can be transferred to the charge accumulation node FD at any timing. The signal electric charge transferred to the charge accumulation node FD is temporarily held in the charge accumulation node FD and is read out to the output signal line $S_j$ at a predetermined timing by the signal detection circuit 33.

As schematically illustrated in FIG. 2, the first initialization circuit 31 and the second initialization circuit 32 are coupled to the signal detection circuit 33. In a typical embodiment of the present disclosure, the first initialization circuit 31 and the second initialization circuit 32 reset an electric potential of the charge accumulation node FD and an electric potential of the photoelectric converter 20, respectively by using output of the signal detection circuit 33.

Figure 3:
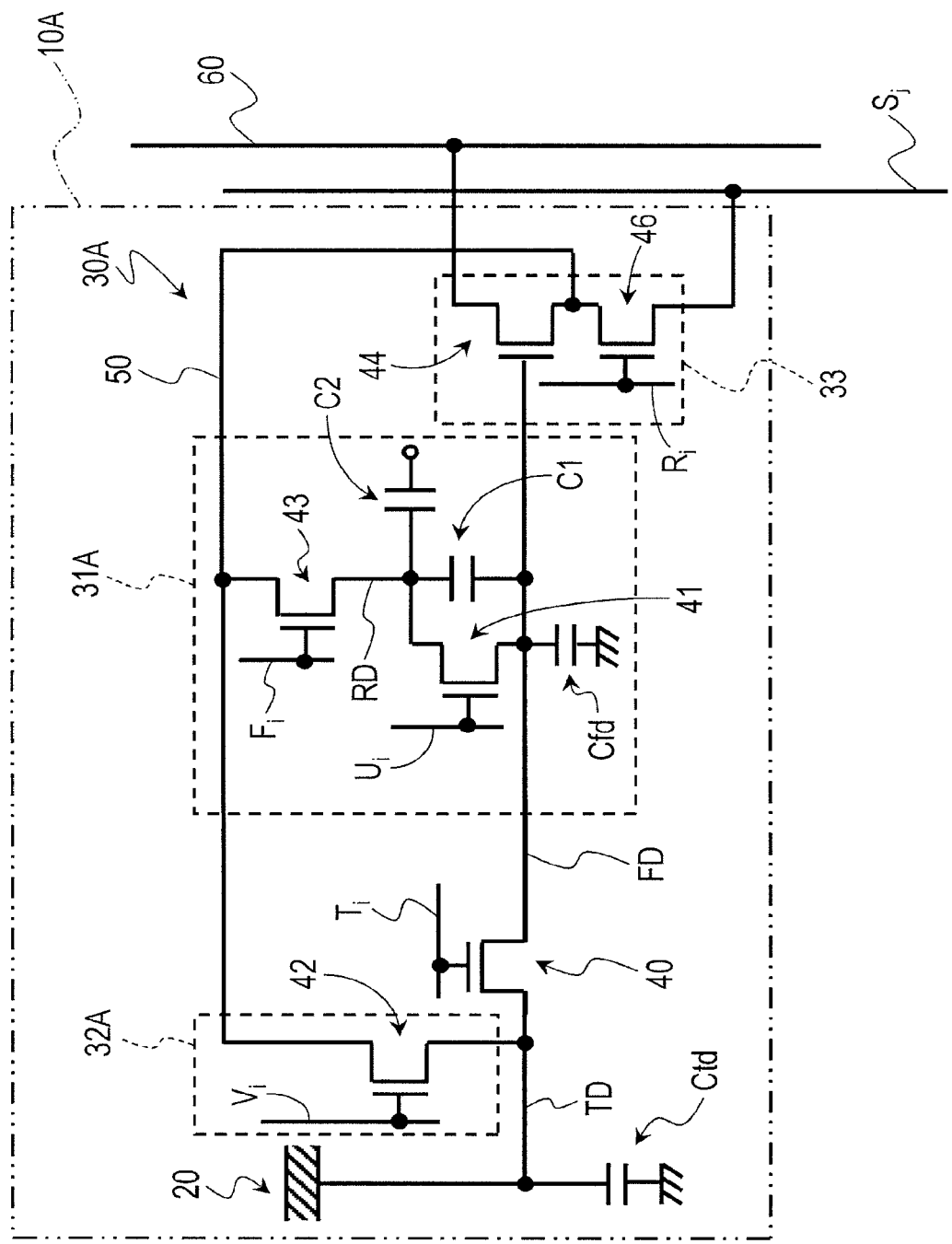
FIG. 3 illustrates an exemplary circuit configuration of a pixel.

FIG. 3 illustrates an exemplary circuit configuration of the pixel 10. A pixel 10A illustrated in FIG. 3 is an example of the pixel 10, and a feedback circuit 30A of the pixel 10A includes a first initialization circuit 31A, a second initialization circuit 32A, and a signal detection circuit 33. In FIG. 3, a capacitor of the node TD is expressed as a capacitor Ctd, and a capacitor of the charge accumulation node FD is expressed as a capacitor Cfd. However, a capacitor need not necessarily be actually coupled to these nodes.

In the example illustrated in FIG. 3, the signal detection circuit 33 has a signal detection transistor 44 and an address transistor 46. The signal detection transistor 44 and the address transistor 46 are typically field-effect transistors, as in the case of the transfer transistor 40. The following describes an example in which the transfer transistor 40, the signal detection transistor 44, and the address transistor 46 are each an N-channel MOS. In the following description, it is assumed that an N-channel transistor is used as other transistors unless otherwise specified.

The signal detection transistor 44 is coupled between a power line 60 and the address transistor 46, and a gate of the signal detection transistor 44 is coupled to the charge accumulation node FD. The power line 60 supplies a predetermined voltage to each pixel 10A. For example, appropriate switching circuit and power supply are coupled to the power line 60, and thus the power line 60 can selectively apply a power-supply voltage VDD of approximately 3.3 V and a voltage of 0 V to each pixel 10A. In a state where the power-supply voltage VDD is applied to each pixel 10A, the power line 60 functions as a source follower power supply, and the signal detection transistor 44 supplies a signal corresponding to an amount of electric charge accumulated in the charge accumulation node FD to the address transistor 46.

A source of the address transistor 46 is coupled to the output signal line $S_j$, and the row control line $R_i$ is coupled to a gate of the address transistor 46. That is, the row scanning circuit 80 can selectively read out output of the signal detection transistor 44 to the output signal line $S_j$ in a form of a signal voltage by controlling a level of a voltage applied to the row control line $R_i$.

The first initialization circuit 31A has a first reset transistor 41 and a feedback transistor 43. As illustrated in FIG. 3, one of a source and a drain of the first reset transistor 41 is coupled to the charge accumulation node FD. The other of the source and the drain of the first reset transistor 41, in other words, one of the source and the drain that is not coupled to the charge accumulation node FD is coupled to a feedback line 50 via the feedback transistor 43. The feedback line 50 is a signal line coupled to a source of the signal detection transistor 44. That is, the feedback transistor 43 is coupled between one of the source and drain of the first reset transistor 41 that is not coupled to the charge accumulation node FD and the source of the signal detection transistor 44.

A first reset control line $U_i$ and a feedback control line $F_i$ are coupled to a gate of the first reset transistor 41 and a gate of the feedback transistor 43, respectively. The first reset control line $U_i$ and the feedback control line $F_i$ are coupled, for example, to the row scanning circuit 80. In this case, the row scanning circuit 80 can control ON and OFF of the first reset transistor 41 and the feedback transistor 43 by controlling a level of a voltage applied to the first reset control line $U_i$ and the feedback control line $F_i$. When the first reset transistor 41 and the feedback transistor 43 are turned on, a feedback loop is formed that allows the whole or part of an output signal of the signal detection transistor 44 to be electrically fed back to one of the source and the drain of the first reset transistor 41 that is not coupled to the charge accumulation node FD. This can reset an electric potential of the charge accumulation node FD to a predetermined electric potential.

Furthermore, the first initialization circuit 31A has a first capacitor C1 and a second capacitor C2 that are coupled in parallel to the first reset transistor 41. Assume that a node between the one of the source and the drain of the first reset transistor 41 that is not coupled to the charge accumulation node FD and the feedback transistor 43 is a node RD, one of electrodes of the second capacitor C2 is coupled to the node RD. Typically, a capacitance value of the second capacitor C2 is larger than a capacitance value of the first capacitor C1. A control line (not illustrated) is coupled to the other of the electrodes of the second capacitor C2, and thus a predetermined voltage is supplied to the other of the electrodes of the second capacitor C2 during operation of the imaging device 100. As described later, in a case where an initialization circuit has the first capacitor C1 and the second capacitor C2, kTC noise that is generated by turning a transistor off can be effectively reduced.

For example, the first capacitor C1 and the second capacitor C2 each may have a metal-insulator-semiconductor (MIS) structure or may have a metal-insulator-metal (MIM) structure. The first capacitor C1 and the second capacitor C2 need not necessarily have a common structure. A "capacitor" as used herein refers to a structure in which a dielectric body such as an insulating film is sandwiched between electrodes. An "electrode" as used herein is not limited to an electrode made of a metal and is widely interpreted to encompass a polysilicon layer and the like. An "electrode" as used herein may be part of a semiconductor substrate.

The second initialization circuit 32A has a second reset transistor 42, and one of a source and a drain of the second reset transistor 42 is coupled to the node TD, and the other of the source and the drain of the second reset transistor 42 is coupled to the feedback line 50. For example, a second reset control line $V_i$ coupled to the row scanning circuit 80 is coupled to a gate of the second reset transistor 42. The row scanning circuit 80 can control ON and OFF of the second reset transistor 42 by controlling a level of a voltage applied to the second reset control line $V_i$. When the second reset transistor 42 is turned on, a feedback loop is formed that allows the whole or part of an output signal of the signal detection transistor 44 to be electrically fed back to one of the source and the drain of the second reset transistor 42 that is not coupled to the node TD. This can reset an electric potential of the photoelectric converter 20 to a predetermined electric potential.

As described above, it can be said that the feedback circuit 30A is a circuit that electrically feeds output of the signal detection transistor 44 back to the charge accumulation node FD and the photoelectric converter 20. As described below, in the embodiment of the present disclosure, typically, the photoelectric converter 20 and the charge accumulation node FD are sequentially reset.

Example of Operation of Imaging Device

Figure 4:
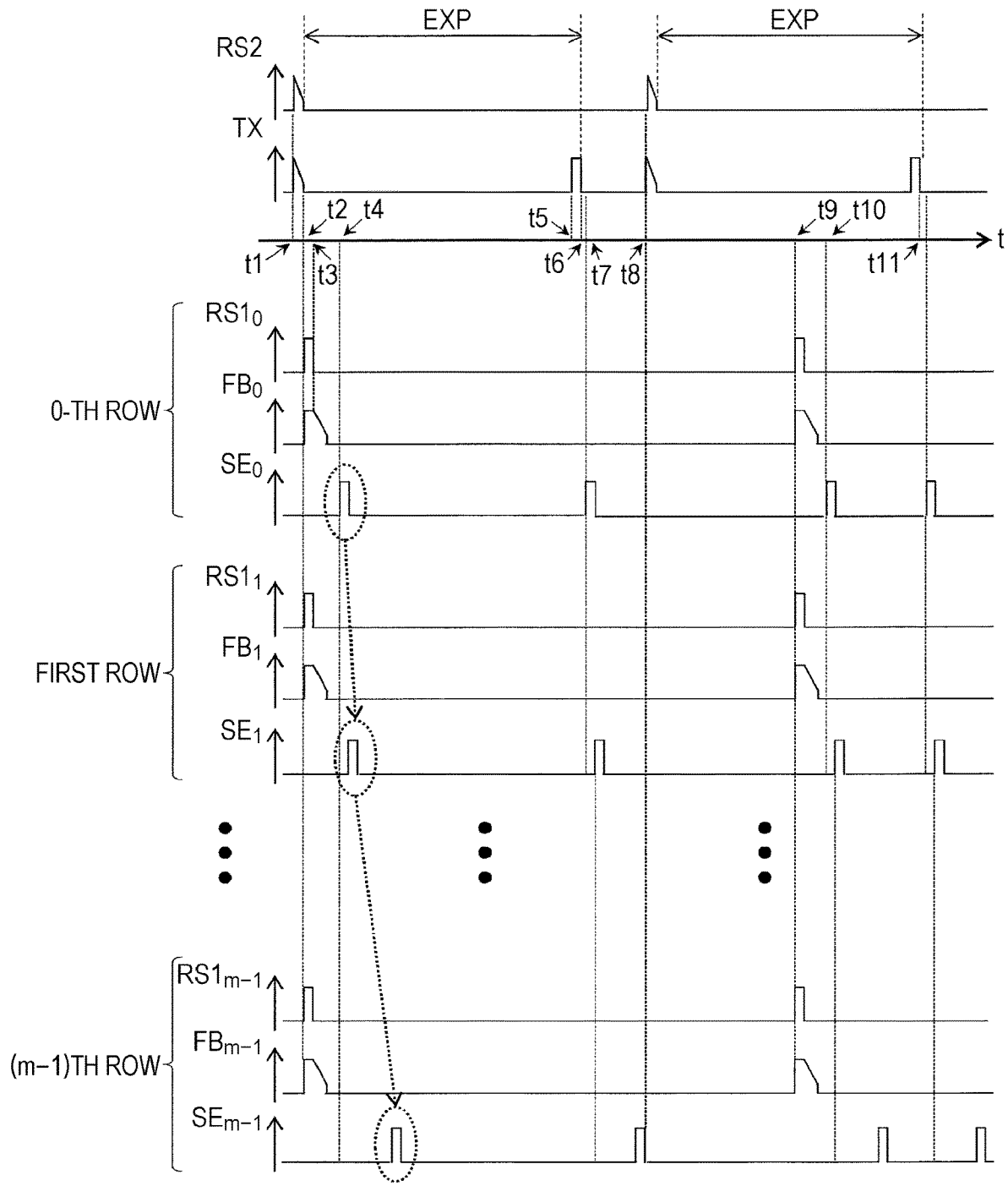
FIG. 4 is a timing diagram for explaining an example of operation of the imaging device.

FIG. 4 is a timing diagram for explaining an example of operation of the imaging device 100. In FIG. 4, the graph of $RS1_i$ and the graph of $FB_i$ represent changes in voltage level of the first reset control line $U_i$ and the feedback control line $F_i$ in the i-th row, respectively. In other words, the graph of $RS1_i$ and the graph of $FB_i$ represent ON and OFF timings of the first reset transistor 41 and the feedback transistor 43 of the pixel 10A belonging to the i-th row. Similarly, the graph of $SE_i$ represents a change in voltage level of the row control line $R_i$ in the i-th row. The graph of $RS_2$ and the graph of TX in the upper part of FIG. 4 represent changes in voltage level of the second reset control line $V_i$ and the transfer control line $T_i$ in each row, respectively. As is clear from the description below, in this example, timings at which the second reset transistor 42 and the transfer transistor 40 are turned on and off are common to all pixels. Therefore, each of the changes in voltage level of the second reset control line $V_i$ and the transfer control line $T_i$ in each row is represented by a single graph.

During imaging, an electronic shutter operation is performed, i.e., the photoelectric converter 20 and the charge accumulation node FD are reset. As illustrated in FIG. 4, first, the second reset transistor 42 and the transfer transistor 40 are turned on in a state where the address transistor 46 is off (time t1). At this timing, the first reset transistor 41 and the feedback transistor 43 are off.

When the second reset transistor 42 and the transfer transistor 40 are turned on, a feedback loop that allows output of the signal detection transistor 44 to be fed back to the node TD is formed. Formation of the feedback loop causes the electric potential of the node TD to converge to a predetermined electric potential. In other words, the photoelectric converter 20 can be reset by discharging an unnecessary electric charge from the node TD.

In this example, the second reset transistor 42 and the transfer transistor 40 in all of the pixels 10A of the pixel array PA are switched on and off all at once. By turning on the second reset transistor 42 and the transfer transistor 40 in each row, the photoelectric converter 20 in all of the pixels 10A of the pixel array PA can be reset all at once.

Next, the second reset transistor 42 and the transfer transistor 40 are turned off (time t2). In this example, as illustrated in FIG. 4, an electric potential of the second reset control line $V_i$ is gradually changed from a high level to a low level so as to cross a threshold voltage of the second reset transistor 42. When the electric potential of the second reset control line $V_i$ is gradually decreased from a high level toward a low level at which the second reset transistor 42 is turned off, the second reset transistor 42 gradually changes from an ON state to an OFF state. Similarly, in this example, the electric potential of the transfer control line $T_i$ is also gradually changed from a high level to a low level so as to cross a threshold voltage of the transfer transistor 40, and thus the transfer transistor 40 is changed from an ON state to an OFF state by such a voltage change.

As for the second reset transistor 42, the node TD has a parasitic capacitance component as schematically illustrated in a form of the capacitor Ctd in FIG. 3, and therefore the second reset transistor 42 forms an RC filter circuit together with the capacitance component parasitic to the node TD. When the electric potential of the second reset control line $V_i$ is decreased, a resistance component of the second reset transistor 42 increases, and a bandwidth of the second reset transistor 42 narrows. As a result, a frequency range of a signal fed back to the node TD narrows. That is, the second reset transistor 42 functions as a bandwidth control circuit that puts a bandwidth limitation to output of the signal detection transistor 44.

At this timing, for example, a voltage of 0 V is supplied from the power line 60 to each pixel 10A. The second reset transistor 42 is turned off by gradually decreasing the electric potential of the second reset control line $V_i$ from a high level to a low level. This makes it possible to reduce noise remaining in the node TD, which is from kTC noise generated when the second reset transistor 42 is turned off, compared with a case where there is no feedback. Assume that an amplification ratio in a case where the signal detection transistor 44 functions as an amplifier is (−A), kTC noise remaining in the node TD can be suppressed to be $1/(1+A)^{1/2}$ times where A is typically larger than 1 and has a value of approximately several tens to several hundreds. Details of such noise cancelling by using feedback are described in Japanese Unexamined Patent Application Publication No. 2016-127593, the entire contents of which are herein incorporated by reference.

The same applies to the transfer transistor 40. The transfer transistor 40 is turned off by gradually decreasing the electric potential of the transfer control line $T_i$ from a high level to a low level. This makes it possible to reduce noise remaining in the node TD, which is from kTC noise generated when the transfer transistor 40 is turned off, compared with a case where there is no feedback. In this example, the electric potential of the second reset control line $V_i$ and the electric potential of the transfer control line $T_i$ in each row are successively decreased from a high level to a low level, the electric potential of the second reset control line $V_i$ and/or the electric potential of the transfer control line $T_i$ in each row may be decreased in stages from a high level to a low level.

When the photoelectric converter 20 is reset, accumulation of an electric charge generated by the photoelectric converter 20 in the node TD starts. At this timing, the transfer transistor 40 is off, and therefore the node TD and the charge accumulation node FD are electrically separate from each other. The both-sided arrows EXP in FIG. 4 each indicate an exposure period, i.e., a period of accumulation of a signal electric charge.

Next, during the exposure period, the charge accumulation node FD is reset. After the second reset transistor 42 is turned off or at the same timing as a timing at which the second reset transistor 42 is turned off, the first reset transistor 41 and the feedback transistor 43 are turned on. When the first reset transistor 41 and the feedback transistor 43 are turned on, a feedback loop that allows output of the signal detection transistor 44 to be fed back to the charge accumulation node FD is formed. Formation of the feedback loop causes the electric potential of the charge accumulation node FD to converge to a predetermined electric potential, thereby resetting the charge accumulation node FD.

Next, the first reset transistor 41 in each pixel 10A is turned off by shifting the electric potential of the first reset control line $U_i$ in each row to a low level (time t3). As a result, the charge accumulation node FD and the node RD are electrically coupled via the first capacitor C1 in a state where the first reset transistor 41 is off. In this state, a signal supplied from the feedback transistor 43 to the node RD is attenuated by an attenuation circuit formed by the first capacitor C1 and a parasitic capacitance component of the charge accumulation node FD and fed back to the charge accumulation node FD. An attenuation rate B in this case is expressed as Cc/(Cc+Cf) where Cc is a capacitance value of the first capacitor C1, and Cf is a capacitance value of the parasitic capacitance component of the charge accumulation node FD.

An amplification rate in the signal detection circuit 33 including the signal detection transistor 44 in a state where the first reset transistor 41 is off is (−A)*B ("*" represents multiplication). Therefore, kTC noise generated when the first reset transistor 41 is turned off can be suppressed to be 1/(1+A*B) times as large as that in a case where there is no feedback.

Next, the feedback transistor 43 is turned off by gradually changing the electric potential of the feedback control line $F_i$ from a high level to a low level so as to cross a threshold voltage of the feedback transistor 43. Formation of the feedback loop continues until the feedback transistor 43 is turned off. The feedback transistor 43 constitutes an RC filter circuit together with the second capacitor C2. When a resistive component of the feedback transistor 43 is increased by fall of a voltage level of the feedback control line $F_i$, a bandwidth of the feedback transistor 43 becomes narrow. Accordingly, a frequency range of a signal fed back to the charge accumulation node FD via the feedback transistor 43 becomes narrow.

By turning the feedback transistor 43 off in a state where an operation bandwidth of the feedback transistor 43 is narrower than an operation bandwidth of the signal detection transistor 44, kTC noise generated when the feedback transistor 43 is turned off can be suppressed to be $1/(1+A*B)^{1/2}$ times by the feedback circuit 30A.

In the circuit configuration described with reference to FIG. 3, the second capacitor C2 is coupled to the node RD. Accordingly, kTC noise generated when the feedback transistor 43 is turned off is $(Cf/Cs)^{1/2}$ times as large as that in a case where there is no feedback, where Cs is a capacitance value of the second capacitor C2. The kTC noise remaining in the charge accumulation node FD after the feedback transistor 43 is turned off is a sum of squares of kTC noise generated when the first reset transistor 41 is turned off and kTC noise generated when the feedback transistor 43 is turned off. Consequently, kTC noise remaining in the charge accumulation node FD is $[1+((1+A*B)*Cf/Cs)]^{1/2}/(1+A*B)$ times as large as that in a case where there is no feedback.

By thus turning the feedback transistor 43 off in a state where an operation bandwidth of the feedback transistor 43 is narrower than an operation bandwidth of the signal detection transistor 44, total kTC noise remaining in the charge accumulation node FD can be reduced. As is clear from the above formula, kTC noise can be more effectively reduced by making the capacitance value of the second capacitor C2 larger than the capacitance value of the first capacitor C1. The electric potential of the feedback control line $F_i$ may be successively decreased from a high level to a low level or may be decreased in stages from a high level to a low level as in the case where the second reset transistor 42 is turned off.

After the charge accumulation node FD is reset, the address transistor 46 is turned on (time t4). By turning the address transistor 46 on, a signal corresponding to an electric potential of the charge accumulation node FD is read out from each pixel 10A to the output signal line $S_j$ by the signal detection circuit 33. In this state, the power line 60 supplies the power-supply voltage VDD to each pixel 10A.

The signal thus read out is a signal of a reference level corresponding to a reset level. As indicated by the broken-line ellipses and the arrows in FIG. 4, the signal is sequentially read out per row of the plurality of pixels 10A. After the signal of the reference level is read out, the address transistor 46 is turned off.

As is clear from FIG. 4, in this example, the signal is read out from each pixel 10A during the electric charge accumulation period. According to the embodiment of the present disclosure, the charge accumulation node FD is coupled to the photoelectric converter 20 via the transfer transistor 40, a signal corresponding to the electric potential of the charge accumulation node FD can be read out in parallel with accumulation of a signal electric charge in the node TD.

After elapse of a predetermined period, the transfer transistor 40 is turned on by shifting a voltage level of the transfer control line $T_i$ to a high level (time t5). When the transfer transistor 40 is turned on, an electric charge, i.e., a signal electric charge accumulated in the node TD until the transfer transistor 40 is turned on is transferred to the charge accumulation node FD. Then, the transfer transistor 40 is turned off by shifting a voltage level of the transfer control line $T_i$ to a low level again (time t6). As schematically illustrated in FIG. 4, a period from a timing at which the photoelectric converter 20 is reset to a timing at which the transfer transistor 40 is turned off is an exposure period, i.e., an electric charge accumulation period in this example. Timings at which the transfer transistor 40 is turned on and off are common to all rows of the plurality of pixels 10A. That is, the start and end of the electric charge accumulation period are common to all of the pixels 10A, and thus global shutter is realized.

By turning the address transistor 46 on (time t7) after the signal electric charge is transferred to the charge accumulation node FD, a signal corresponding to an amount of electric charge transferred to the charge accumulation node FD is read out. The signal is read out per row of the plurality of pixels 10A. An image signal can be obtained by calculating a difference between the signal thus read out and the signal of the reference level.

After the signal is read out for all of the rows, i.e., after the address transistor 46 in a final row is turned off, the photoelectric converter 20 is reset according to the above procedure by turning the second reset transistor 42 and the transfer transistor 40 on again (time t8). An electric charge accumulation period of the second frame starts at a timing at which reset of the photoelectric converter 20 is completed. As illustrated in FIG. 4, the electric charge accumulation period can be started at a timing common to all of the pixels 10A by resetting the photoelectric converter 20 in all of the rows at a common timing.

Next, the first reset transistor 41 and the feedback transistor 43 are turned on (time t9), and thus the charge accumulation node FD is reset according to the above procedure. The charge accumulation node FD can be reset in all of the rows at a common timing. By turning the address transistor 46 on (time t10) after the charge accumulation node FD is reset, in other words, after the feedback transistor 43 is turned off, a signal of a reference level that corresponds to a reset level of the second frame is read out. The signal of the reference level can be read out at any timing as long as readout of the signal in the final row can be finished until the transfer transistor 40 is turned on again.

Then, an electric charge accumulated in the node TD is transferred to the charge accumulation node FD by turning the transfer transistor 40 on at a predetermined timing. The electric charge accumulation period of the second frame is finished (time t11) by turning the transfer transistor 40 off. The following signal readout operation is similar to the readout operation in the first frame, and the above procedure is repeated thereafter.

As is clear from the above description, signal readout is sequentially executed per row, whereas a timing at which the second reset transistor 42 is turned off and a timing at which the transfer transistor 40 is turned off are common to all of the pixels 10A. That is, the start and end of an electric charge accumulation period are common to all of the pixels 10A, and thus global shutter is realized.

In the embodiment of the present disclosure, the transfer transistor 40 is interposed between the charge accumulation node FD and the photoelectric converter 20. That is, the node TD and the charge accumulation node FD are electrically separate from each other in a state where the transfer transistor 40 is off. This allows the charge accumulation node FD to be reset and allows a signal of a reference level to be read out in parallel with accumulation of an electric charge in the node TD. In other words, a period for reset of the charge accumulation node FD and readout of a signal of a reference level can overlap the electric charge accumulation period. This makes it unnecessary to separately prepare a non-exposure period in order to secure a period for reset of the charge accumulation node FD and readout of a signal, thereby shortening a period that does not contribute to accumulation of an electric charge and thus improving a frame rate. Alternatively, an exposure period can be prolonged.

Furthermore, according to the configuration illustrated in FIG. 3, the feedback circuit 30A includes the first initialization circuit 31A and the second initialization circuit 32A that are independently coupled to the photoelectric converter 20 and the charge accumulation node FD, respectively. These initialization circuits reset an electric potential of the photoelectric converter 20 and an electric potential of the charge accumulation node FD by utilizing feedback. It is therefore possible to reduce kTC noise remaining in the charge accumulation node FD.

According to the circuit configuration illustrated in FIG. 3, two operation modes that are different in sensitivity can be switched by properly controlling a gate voltage of the first reset transistor 41 and a gate voltage of the feedback transistor 43. The example of the operation described with reference to FIG. 4 is operation in a first mode in which imaging at relatively high sensitivity is possible. A second mode described below is a mode suitable for imaging under high illuminance in which imaging at relatively low sensitivity is possible.

For operation in the second mode, it is only necessary to fix an electric potential of the first reset control line $U_i$ to a high level and thus fix the first reset transistor 41 to an ON state in control of voltages of the control lines described with reference to FIG. 4. Fixing the first reset transistor 41 to an ON state causes the second capacitor C2, which has a relatively large capacitance value, to be coupled to the charge accumulation node FD and thereby increases a capacitance value of the whole charge accumulation node FD. It is therefore possible to accumulate more electric charges.

In the second mode, formation and cancellation of a feedback loop, which allows output of the signal detection transistor 44 to be fed back to the charge accumulation node FD, are controlled by turning the feedback transistor 43 on and off. That is, in the second mode, the feedback transistor 43 can function as a reset transistor. As described with reference to FIG. 4, influence of kTC noise generated when the feedback transistor 43 is turned off can be reduced by gradually changing the electric potential of the feedback control line $F_i$ from a high level to a low level so as to cross a threshold voltage of the feedback transistor 43. Under relatively low sensitivity, it is requested that capacitance of a whole signal electric charge accumulation region be large, whereas influence of noise to image quality is small.

In the first mode, the second capacitor C2 is not directly coupled to the charge accumulation node FD and is coupled to the charge accumulation node FD via the first capacitor C1. Therefore, a decrease in S/N ratio can be avoided by making the capacitance value of the first capacitor C1 small even in a case where the second capacitor C2 has a relatively large capacitance value. A ratio (Cc/Cs) of the capacitance values can be, for example, approximately 1/10.

The circuit configuration illustrated in FIG. 3 thus allows the first reset transistor 41 to function as a transistor for gain switching. Details of such mode switching are described in Japanese Unexamined Patent Application Publication No. 2017-046333, the entire contents of which are incorporated herein by reference.

Example of Device Structure of Pixel 10

Figure 5:
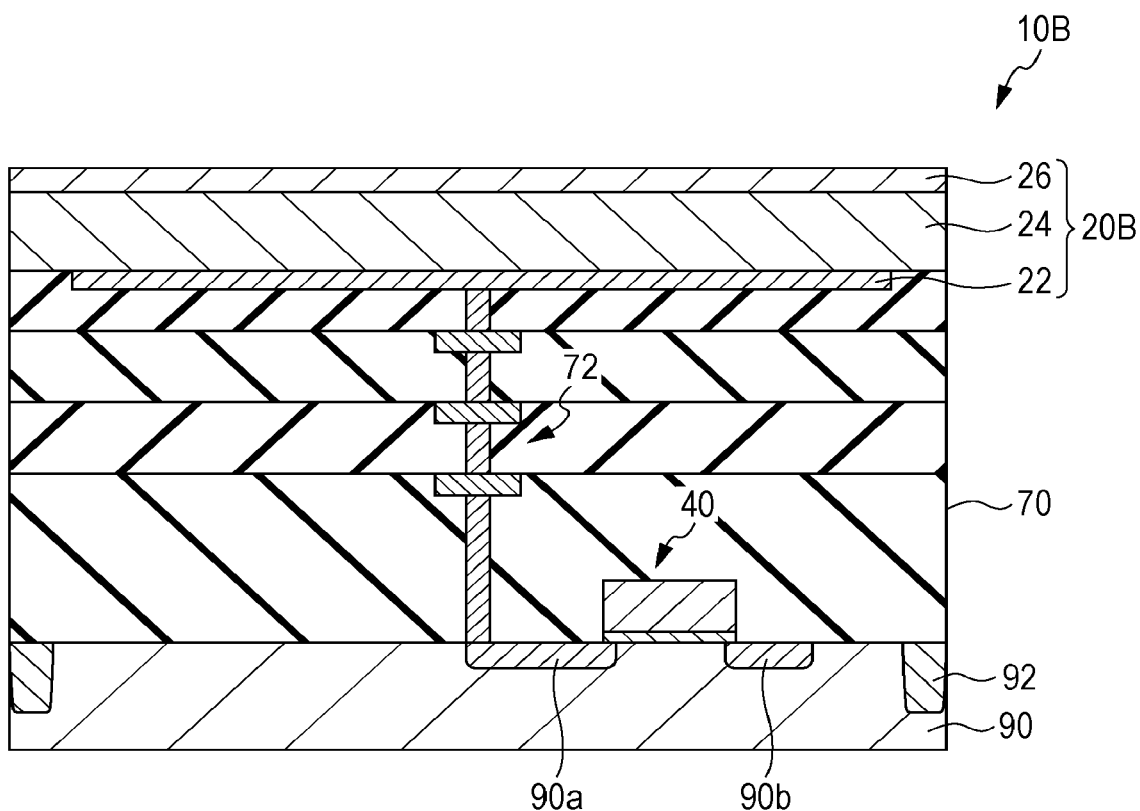
FIG. 5 is a cross-sectional view schematically illustrating a device structure of a pixel having, as a photoelectric converter, a multilayer structure including a pixel electrode, a photoelectric conversion layer, and a counter electrode.

An example of a device structure of each pixel 10 is described. FIG. 5 schematically illustrates a device structure of a pixel 10B having, as the photoelectric converter 20, a multilayer structure including a pixel electrode 22, a photoelectric conversion layer 24, and a counter electrode 26. The pixel 10B is an example of the pixel 10 illustrated in FIGS. 1 and 2 as in the case of the pixel 10A.

In the configuration illustrated in FIG. 5, the pixel 10B includes a semiconductor substrate 90, an interlayer insulating layer 70 that covers the semiconductor substrate 90, and a photoelectric converter 20B supported by the interlayer insulating layer 70. The photoelectric converter 20B has the pixel electrode 22 supported by the interlayer insulating layer 70, the photoelectric conversion layer 24 on the pixel electrode 22, and the counter electrode 26 that covers the photoelectric conversion layer 24.

The pixel electrode 22 is provided for each pixel 10B and is electrically separated from the pixel electrode 22 of an adjacent pixel 10B by being spatially separated from the pixel electrode 22 of the adjacent pixel 10B. The pixel electrode 22 is made of a metal such as aluminum or copper, a metallic nitride, polysilicon given conductivity by being doped with an impurity, or the like. The photoelectric conversion layer 24 is made of an organic material or an inorganic material such as amorphous silicon and generates positive and negative electric charges, for example, a hole-electron pair by photoelectric conversion. Typically, the photoelectric conversion layer 24 is formed throughout a plurality of pixels 10B. The photoelectric conversion layer 24 may include a layer made of an organic layer and a layer made of an inorganic layer. The counter electrode 26 is an electrode made of a transparent conductive material such as ITO and is disposed on a light incident side out of two main surfaces of the photoelectric conversion layer 24. Typically, the counter electrode 26 is formed throughout a plurality of pixels 10B as in the case of the photoelectric conversion layer 24.

The semiconductor substrate 90 includes a plurality of impurity regions in each pixel 10B. For simplification, two impurity regions 90a and 90b among these impurity regions are illustrated in FIG. 5. In the example illustrated in FIG. 5, one of the impurity regions 90a and 90b functions as a drain region of the transfer transistor 40, and the other of the impurity regions 90a and 90b functions as a source region of the transfer transistor 40. Although illustration of transistors other than the transfer transistor 40 is omitted in FIG. 5, various transistors included in the first initialization circuit 31, the second initialization circuit 32, and the signal detection circuit 33 can be formed on the semiconductor substrate 90. The semiconductor substrate 90 also has an element separation region 92 for electric separation from an element formed in an adjacent pixel 10B. The semiconductor substrate 90 is not limited to a substrate that is entirely a semiconductor and may be, for example, an insulating substrate having a semiconductor layer on a surface on which an imaging region is formed.

The interlayer insulating layer 70 typically has an insulation structure including a plurality of silicon dioxide layers. As schematically illustrated in FIG. 5, the interlayer insulating layer 70 has a conductive structure 72 that couples the pixel electrode 22 of the photoelectric converter 20B and a circuit on the semiconductor substrate 90. In this example, the pixel electrode 22 and the impurity region 90a serving as the source region or the drain region of the transfer transistor 40 are coupled to each other via the conductive structure 72.

A power line (not illustrated in FIG. 5) is coupled to the counter electrode 26. During operation of the imaging device 100, a predetermined voltage is applied to the counter electrode 26 via the power line (not illustrated), and thus an electric potential difference of approximately 10 V is applied between the counter electrode 26 and the pixel electrode 22. This allows one of the positive and negative electric charges generated by the photoelectric converter 20B to be collected as a signal electric charge by the pixel electrode 22. For example, by making an electric potential of the counter electrode 26 higher than an electric potential of the pixel electrode 22, a positive electric charge can be collected by the pixel electrode 22, and a hole can be accumulated as a signal electric charge in the node TD. Needless to say, an electron may be used as a signal electric charge.

The pixel electrode 22, the conductive structure 72, and the impurity region 90a have a function of temporarily holding a signal electric charge generated by the photoelectric converter 20B. The impurity region 90a constitutes part of the node TD. Meanwhile, the impurity region 90b constitutes part of the charge accumulation node FD.

Modifications

Figure 6:
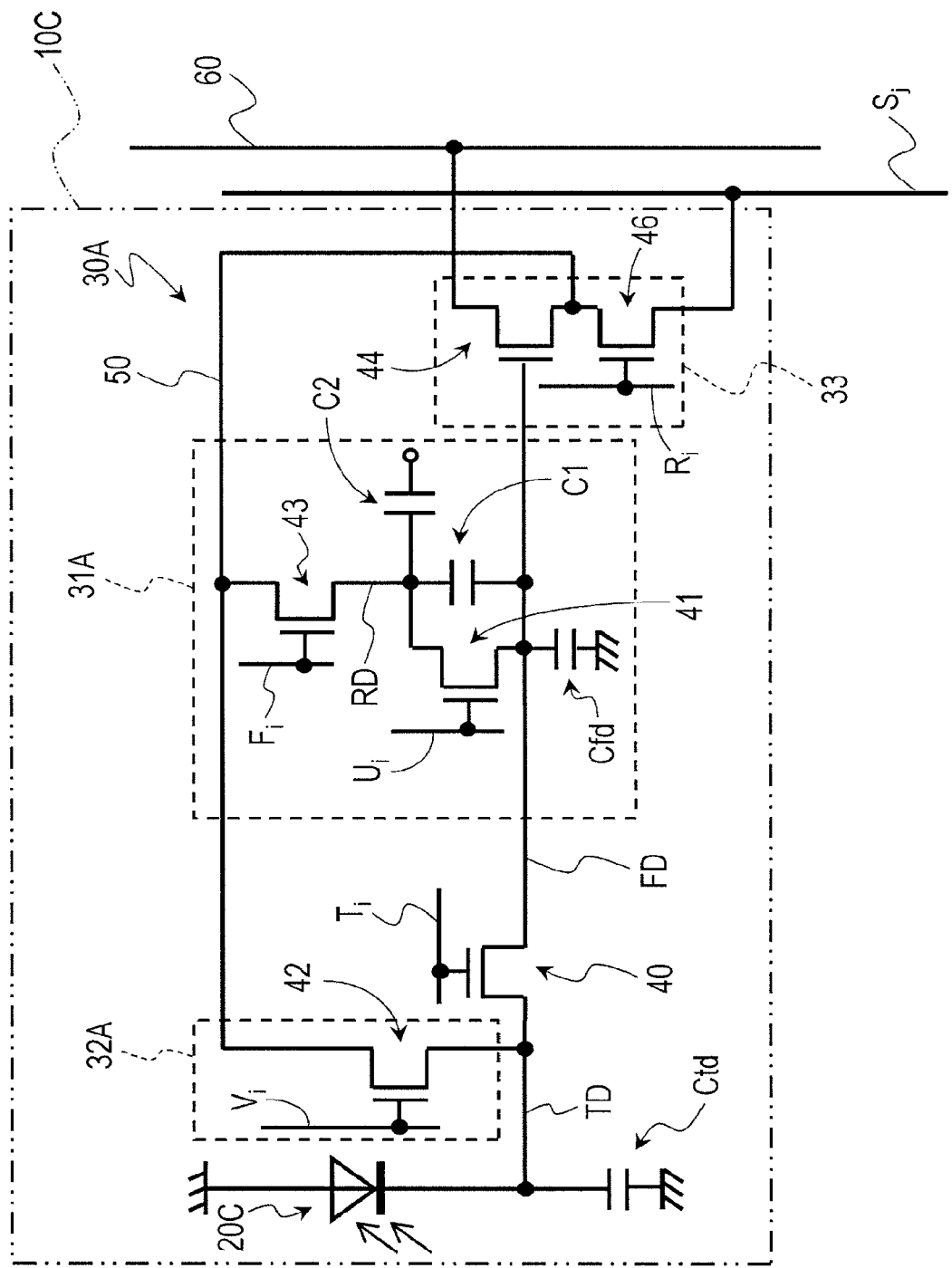
FIG. 6 illustrates a pixel having a photo diode.

A specific configuration of the photoelectric converter 20 is not limited to the example illustrated in FIG. 5. FIG. 6 illustrates a circuit configuration of a pixel 10C having a photo diode 20C. As illustrated in FIG. 6, a photo diode may be applied as the photoelectric converter 20.

Figure 7:
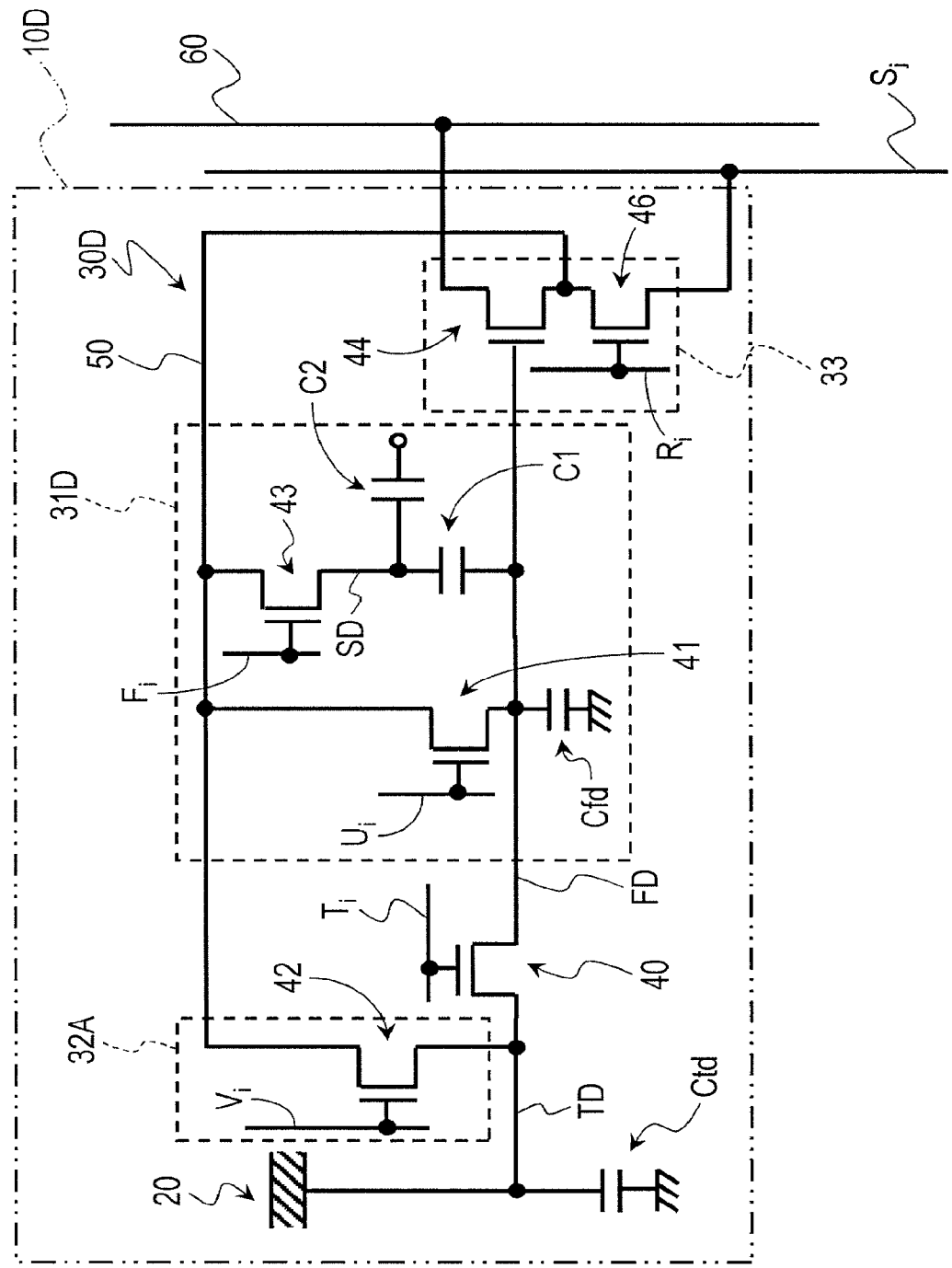
FIG. 7 illustrates another exemplary circuit configuration of a pixel.

FIG. 7 illustrates another exemplary configuration of the pixel 10. A pixel 10D illustrated in FIG. 7 has a feedback circuit 30D instead of the feedback circuit 30A as compared with the pixel 10A described with reference to FIG. 3. The feedback circuit 30D includes a first initialization circuit 31D.

A main difference between the first initialization circuit 31D and the first initialization circuit 31A of FIG. 3 is that one of a source and a drain of the first reset transistor 41 that is not coupled to the charge accumulation node FD in the first initialization circuit 31D is coupled not to the node SD but to the feedback line 50. In other words, one of the source and the drain of the first reset transistor 41 that is not coupled to the charge accumulation node FD in the first initialization circuit 31D is coupled to a source of the signal detection transistor 44.

In the configuration illustrated in FIG. 7, the feedback transistor 43 is coupled between the feedback line 50 and the charge accumulation node FD. In other words, the feedback transistor 43 is coupled between the source of the signal detection transistor 44 and the charge accumulation node FD. The first capacitor C1 is coupled between the feedback transistor 43 and the charge accumulation node FD. This is identical to the first initialization circuit 31A illustrated in FIG. 3. One of the electrodes of the second capacitor C2 is coupled to a node SD between the feedback transistor 43 and the first capacitor C1.

In the circuit configuration of the pixel 10D illustrated in FIG. 7, the first reset transistor 41 cannot be used as a transistor for gain switching. Accordingly, the first mode and the second mode cannot be switched. However, since one of the source and the drain of the first reset transistor 41 that is not coupled to the charge accumulation node FD is directly coupled to the feedback line 50, flexibility of design of an impurity profile for securing driving force of the first reset transistor 41 can be improved.

Operation timings of transistors included in the pixel 10D can be similar to those in the example described with reference to FIG. 4. The circuit configuration illustrated in FIG. 7 also allows reset of the charge accumulation node FD and readout of a signal to be executed in parallel with accumulation of an electric charge in the node TD. This can shorten a non-exposure period and prolong an exposure period.

Figure 8:
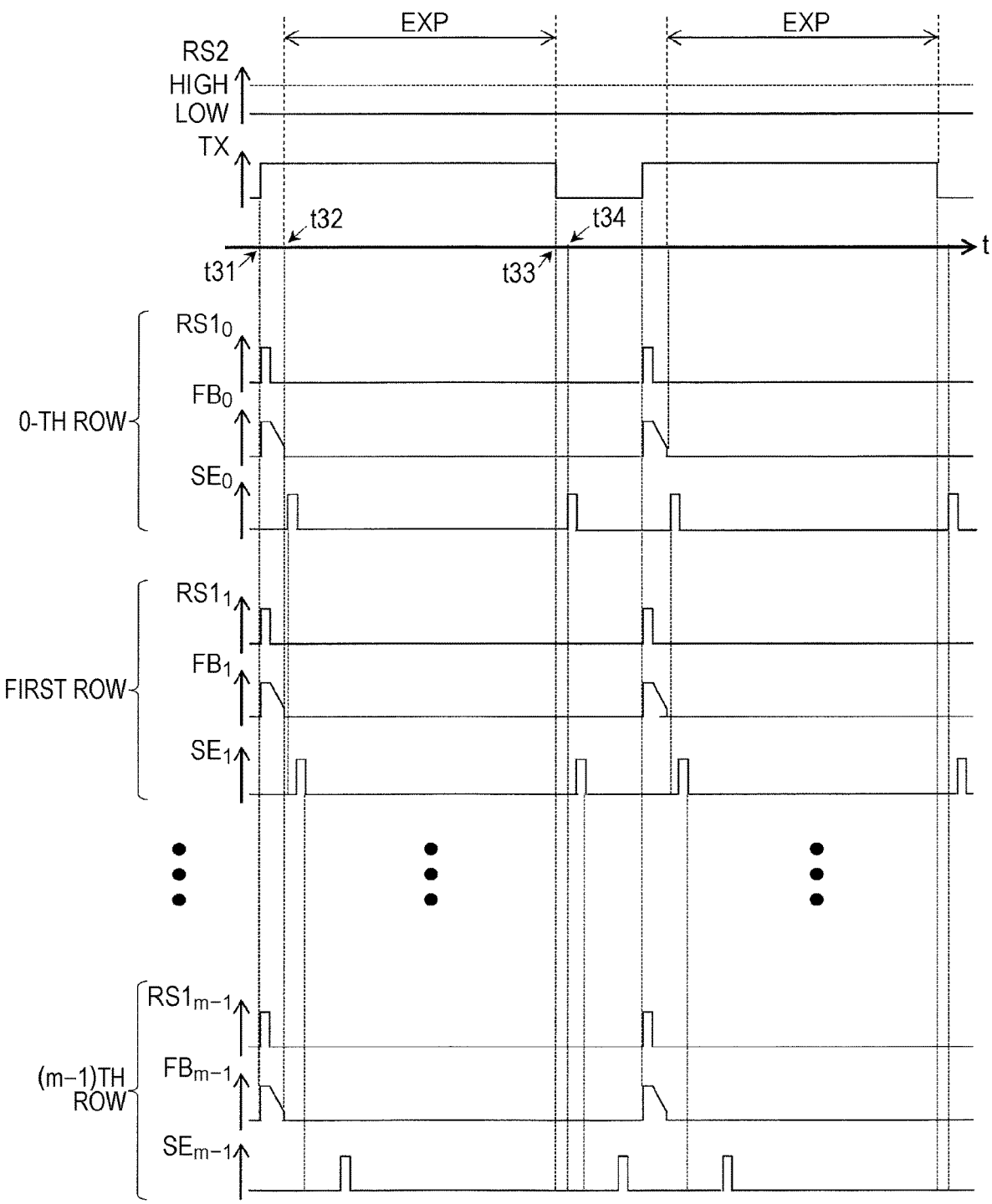
FIG. 8 is a timing diagram for explaining another example of operation of an imaging device having the pixel illustrated in FIG. 7.

FIG. 8 is a timing diagram for explaining another example of operation of an imaging device having the pixel 10D illustrated in FIG. 7. As illustrated in FIG. 8, in this example, a voltage level of the second reset control line $V_i$ is fixed to a low level. That is, imaging is executed while fixing the second reset transistor 42 to an OFF state.

First, the transfer transistor 40 is turned on in a state where the second reset transistor 42 and the address transistor 46 are off (time t31). Furthermore, at this timing, the first reset transistor 41 and the feedback transistor 43 are turned on. When the first reset transistor 41 and the feedback transistor 43 are turned on, a feedback loop that allows output of the signal detection transistor 44 to be fed back to the charge accumulation node FD is formed. Since the transfer transistor 40 is on, not only an electric potential of the charge accumulation node FD, but also an electric potential of the node TD converge to a predetermined electric potential. That is, the charge accumulation node FD and the node TD are collectively reset. The first reset transistor 41 and the feedback transistor 43 may be turned on at the same timing as a timing at which the transfer transistor 40 is turned on or may be turned on after the transfer transistor 40 is turned on.

After the first reset transistor 41 and the feedback transistor 43 are turned on, the first reset transistor 41 and the feedback transistor 43 are sequentially turned off as in the example of the operation described with reference to FIG. 4. As described with reference to FIG. 4, the feedback transistor 43 is turned off (time t32) by gradually changing the electric potential of the feedback control line $F_i$ from a high level to a low level. This makes it possible to reduce kTC noise remaining in the charge accumulation node FD and the node TD.

The address transistor 46 in each row is sequentially turned on without a time interval after the feedback transistor 43 is turned off, and thus a signal of a reference level that corresponds to a reset level is read out. As illustrated in FIG. 8, an exposure period, i.e., a period for accumulation of a signal electric charge starts at a timing at which the feedback transistor 43 is turned off. The signal electric charge is accumulated in the charge accumulation node FD and the node TD. As is clear from FIG. 8, in this example, accumulation of the signal electric charge continues even during readout of a signal in each row. However, it takes a short time to read out the signal of the reference level, and therefore continuation of accumulation of the signal electric charge has substantially almost no influence on the signal of the reference level. A length of the exposure period is, for example, approximately 33 milliseconds, whereas a period from readout of a signal in a 0-th row to the end of readout of a signal in a final row may be, for example, approximately 6 milliseconds.

After elapse of a predetermined period, the transfer transistor 40 is turned off (time t33). When the transfer transistor 40 is turned off, an electric charge of the signal electric charge accumulated during the exposure period is distributed to the charge accumulation node FD, according to a ratio of a capacitance value of a capacitor Ctd in FIG. 7 and a capacitance value of a capacitor Cfd in FIG. 7. When the transfer transistor 40 is turned off, the charge accumulation node FD and the node TD are electrically separated, and therefore the amount of signal electric charge accumulated in the charge accumulation node FD is stored without influence of photoelectric conversion even in a case where an electric charge is further generated in the photoelectric converter 20. That is, a timing at which the transfer transistor 40 is turned off corresponds to the end of an electric charge accumulation period in this example.

After the transfer transistor 40 is turned off, the address transistor 46 in each row is sequentially turned on (time t34), and thus a signal is sequentially read out from each row of the pixel array PA. A time interval from a timing at which the transfer transistor 40 is turned off to a timing at which the address transistor 46 in an initial row is turned on may be any time interval, and readout of a signal per row may be executed at a desired timing. An image signal can be obtained by calculating a difference between the signal thus read out and the signal of the reference level. Operation in the following frames can be identical to the above operation.

According to the example of the operation illustrated in FIG. 8, readout of a signal cannot be executed in parallel with accumulation of a signal electric charge, but the second reset transistor 42 is not turned on and off, and therefore kTC noise generated when the second reset transistor 42 is turned off is not generated. It is therefore possible to reduce total kTC noise. Note that reset of a signal electric charge and signal readout may be executed for each row by shifting timings at which the transfer transistor 40 is turned on and off. This makes it possible to execute rolling shutter operation that is not affected by kTC noise generated when the second reset transistor 42 is turned off.

Figure 9:
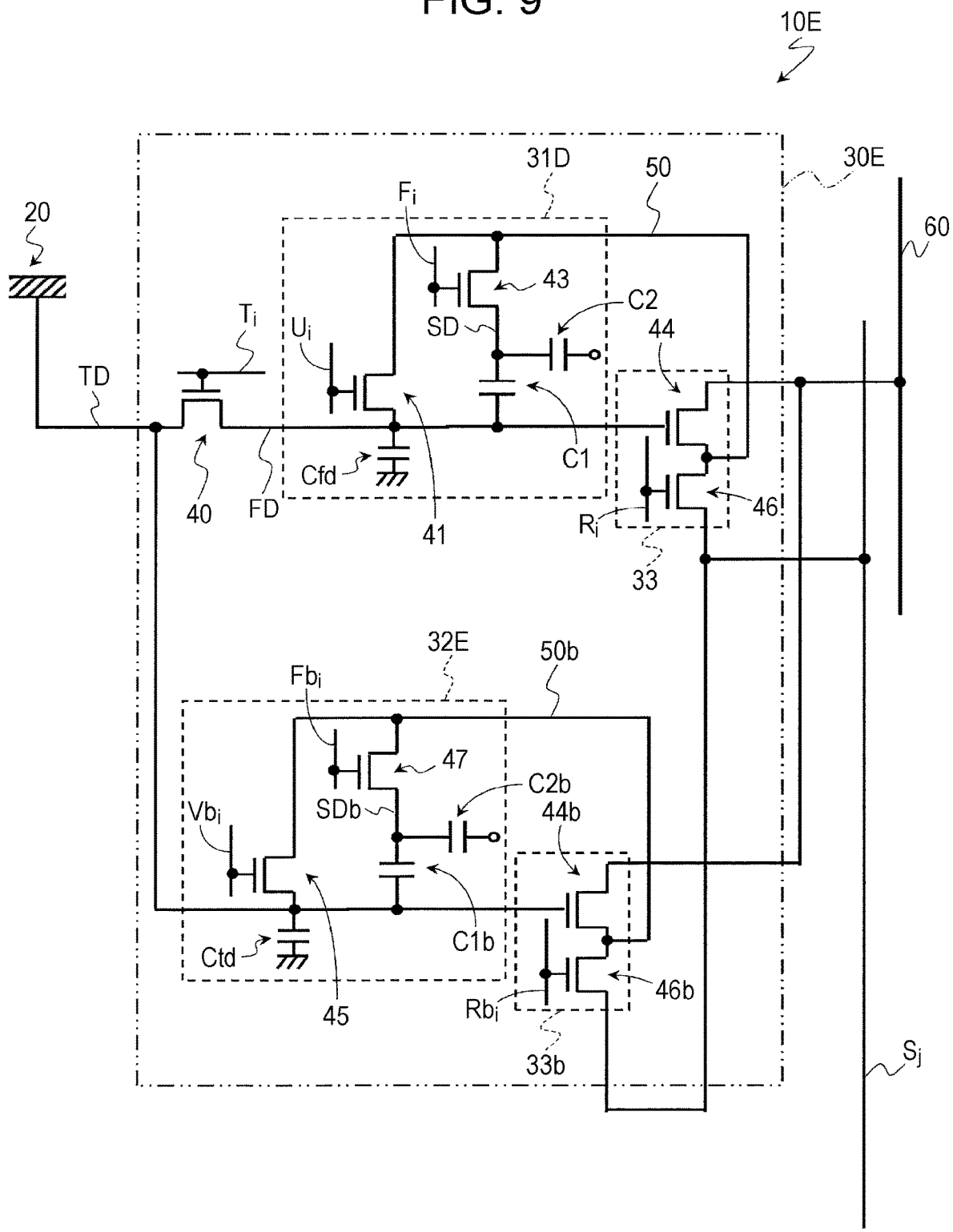
FIG. 9 illustrates still another circuit configuration of the pixel.

FIG. 9 illustrates still another exemplary circuit configuration of the pixel 10. A pixel 10E illustrated in FIG. 9 has a feedback circuit 30E that includes a signal detection circuit 33b in addition to the signal detection circuit 33.

As is clear from comparison between FIGS. 7 and 9, the feedback circuit 30E illustrated in FIG. 9 has a second initialization circuit 32E and the signal detection circuit 33b instead of the second initialization circuit 32A in the feedback circuit 30D illustrated in FIG. 7.

In the example illustrated in FIG. 9, the second initialization circuit 32E has a circuit configuration similar to the first initialization circuit 31D coupled to the charge accumulation node FD. That is, the second initialization circuit 32E includes a first capacitor C1b, a second capacitor C2b, a second reset transistor 45 source or drain of which is coupled to the node TD, and a feedback transistor 47 source or drain of which is coupled to the node TD via the first capacitor C1b.

One of electrodes of the second capacitor C2b is coupled to a node SDb between the feedback transistor 47 and the first capacitor C1b, as in the case of the second capacitor C2 in the first initialization circuit 31D. A control line (not illustrated) coupled to the second capacitor C2 of the first initialization circuit 31D may be coupled to the other of the electrodes of the second capacitor C2b. That is, during operation of the imaging device 100, a voltage identical to a voltage supplied to an electrode of the second capacitor C2 that is not coupled to the node SD can be applied to the other of the electrodes of the second capacitor C2b. Furthermore, the second capacitor C2b typically has a capacitance value larger than the first capacitor C1b, as in the case of the second capacitor C2 in the first initialization circuit 31D.

As illustrated in FIG. 9, a second reset control line $Vb_i$ and a feedback control line $Fb_i$ are coupled to a gate of the second reset transistor 45 and a gate of the feedback transistor 47, respectively. The second reset control line $Vb_i$ and the feedback control line $Fb_i$ are coupled, for example, to the row scanning circuit 80, and ON and OFF of the second reset transistor 45 and the feedback transistor 47 are controlled by the row scanning circuit 80.

The signal detection circuit 33b has a configuration similar to the signal detection circuit 33 and includes an address transistor 46b whose source is coupled to the output signal line $S_j$ and a signal detection transistor 44b whose drain and source are coupled to the power line 60 and the address transistor 46b, respectively. As illustrated in FIG. 9, a gate of the signal detection transistor 44b is coupled to the node TD. Accordingly, a signal corresponding to an amount of electric charge accumulated in the node TD is output from the signal detection transistor 44b.

A row control line $Rb_i$ is coupled to a gate of the address transistor 46b. The row control line $Rb_i$ is a signal line that is independent of the row control line $R_i$ coupled to the address transistor 46 of the signal detection circuit 33. Accordingly, the pixel 10E is configured to be capable of controlling ON and OFF of the address transistor 46 and ON and OFF of the address transistor 46b independently. The row control line $Rb_i$ is coupled, for example, to the row scanning circuit 80, and an electric potential of the row control line $Rb_i$ can be controlled by the row scanning circuit 80.

One of the source and the drain of the second reset transistor 45 that is not coupled to the node TD and one of the source and the drain of the feedback transistor 47 that is not coupled to the node SDb are coupled to a feedback line 50b coupled to the source of the signal detection transistor 44b. By turning the second reset transistor 45 and the address transistor 46b on, a feedback loop can be formed that allows the whole or part of a signal output from the signal detection transistor 44b to be electrically fed back to one of the source and the drain of the second reset transistor 45 that is not coupled to the node TD. That is, the feedback circuit 30E includes a feedback loop that electrically feeds back output of the signal detection transistor 44b of the second initialization circuit 32E in addition to a feedback loop that electrically feeds back output of the signal detection transistor 44 of the first initialization circuit 31D. The second reset transistor 45 of the second initialization circuit 32E has a function of resetting the photoelectric converter 20, as in the case of the second reset transistor 42.

According to the circuit configuration illustrated in FIG. 9, an initialization circuit including a signal detection circuit is coupled to each of the charge accumulation node FD and the node TD, and therefore a feedback loop can be formed and cancelled independently for each node. It is therefore possible to execute noise cancelling utilizing reset and feedback independently for each node. Noise remaining in the node TD can be more effectively reduced by employing a circuit configuration including the feedback transistor 47, the first capacitor C1b, and the second capacitor C2b as a circuit configuration of the second initialization circuit 32E coupled to the photoelectric converter 20, as in the case of the first initialization circuit 31D.

As for imaging operation, for example, a signal electric charge is accumulated in the node TD in a state where the transfer transistor 40 is off, and then the transfer transistor 40 in all of the rows of the plurality of pixels 10E is turned on. This causes a signal electric charge accumulated in the node TD in a certain frame to be transferred to the node FD. Then, the transfer transistor 40 in all of the rows is turned off again. This electrically separates the node TD and the node FD, and thus an exposure period for the frame ends.

According to the configuration of FIG. 9, the node TD and the node FD are electrically separated, and therefore the node TD in each row can be reset by the second initialization circuit 32E while holding an amount of electric charge transferred to the node FD, in other words, information concerning an image of a subject. By performing control similar to the voltage control in the first reset control line $U_i$ and the feedback control line $F_i$ on the second reset control line $Vb_i$ and the feedback control line $Fb_i$ at a timing at which the photoelectric converter 20 is reset, reset of the electric potential and noise cancelling of the node TD can be performed in a manner similar to reset and noise cancelling of the node FD.

The node TD in all of the rows can be reset all at once, and accumulation of a signal electric charge in the node TD can be started by the end of reset of the node TD. In other words, exposure of a next frame can be started. In this example, a timing at which the transfer transistor 40 is turned on, i.e., a timing at which a signal electric charge is transferred to the node FD and a timing at which the node TD is reset are common to all of the rows. That is, global shutter is realized.

Then, the signal electric charge transferred to the charge accumulation node FD, i.e., a signal of the pixel 10E in each row is sequentially read out at an appropriate timing by row scanning driving. Accumulation of a signal electric charge in the node TD continues even during a period for readout of the signal electric charge. A timing at which the node TD is reset can be set to any timing, and a length of an exposure period can be adjusted depending on the timing at which the node TD is reset. The node TD in all of the rows can be reset at a timing between readout of a signal of the pixel 10E belonging to one row and readout of a signal of the pixel 10E belonging to another row.

One of the source and the drain of the first reset transistor 41 that is not coupled to the charge accumulation node FD may be coupled to the node SD so that the first reset transistor 41 and the first capacitor C1 are electrically in parallel with each other, as in the case of the first reset transistor 41 in the first initialization circuit 31A illustrated in FIG. 3. One of the source and the drain of the second reset transistor 45 that is not coupled to the node TD in the second initialization circuit 32E may be coupled to the node SDb.

Figure 10:
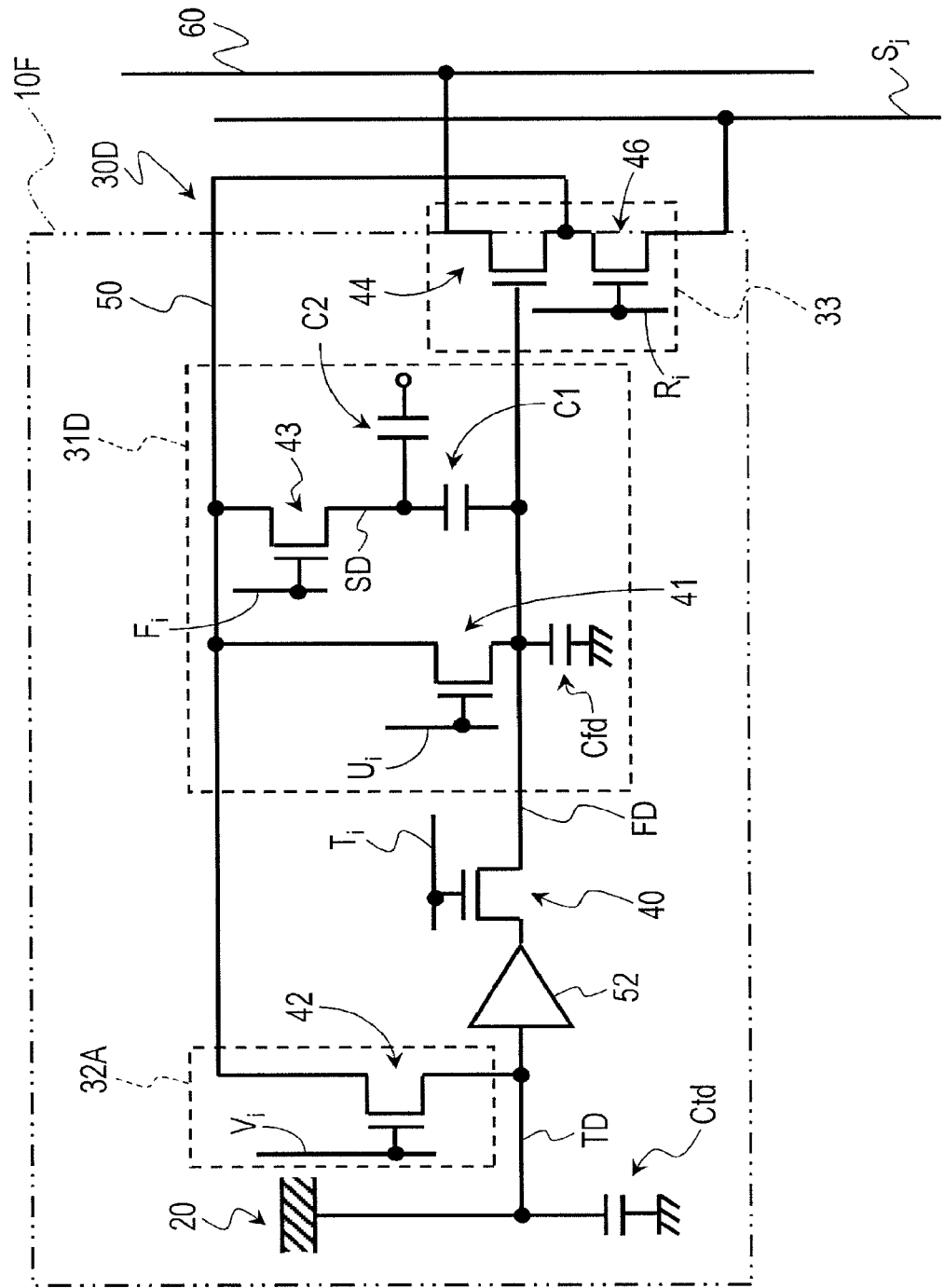
FIG. 10 illustrates still another circuit configuration of the pixel.

FIG. 10 illustrates still another exemplary circuit configuration of the pixel 10. A pixel 1OF illustrated in FIG. 10 further includes a buffer circuit 52 coupled between one of the source and the drain of the second reset transistor 42 that is coupled to the photoelectric converter 20 and the transfer transistor 40 as compared with the pixel 10D described with reference to FIG. 7.

A "buffer circuit" as used herein refers to a circuit including one or more buffers. An example of an individual buffer that constitutes a buffer circuit is an inverter (inverting buffer) using a transistor or an inverting amplifier. Needless to say, a specific circuit configuration of a buffer is not limited to an inverter, and a source follower, an emitter follower, or a voltage follower using an operational amplifier can be used as a buffer of a buffer circuit.

By interposing the buffer circuit 52 between the photoelectric converter 20 and the transfer transistor 40, an S/N ratio can be improved, and influence of noise can be reduced relatively. As a result, influence of kTC noise generated when the transfer transistor 40 is turned off is reduced. As described above, the buffer circuit 52 may be coupled between the transfer transistor 40 and a circuit that is followed by the transfer transistor 40.

Each of the transistors in the examples described above may be a P-channel MOS. Not all of the transistors included in each pixel need be N-channel MOSs and not all of the transistors included in each pixel need be P-channel MOSs. Not only a field-effect transistor, but also a bipolar transistor or the like can be used as these transistors. It is noted that "one of a source and a drain" means either a source or a drain, and "the other of the source and the drain" means the source or the drain that is not previously selected. Additionally, when a bipolar transistor is used, "source", "drain" and "gate" in the present specification mean "emitter", "collector" and "base", respectively. When an element is referred to as being "coupled to" another element, it can be directly coupled to the other element or intervening elements may be present. In contrast, when an element is referred to as being "directly coupled to" another element, there are no intervening elements present.

An imaging device of the present disclosure is applicable, for example, to an image sensor. The imaging device of the present disclosure can be used, for example, for a camera for medical use, a camera for a robot, a security camera, a camera mounted in a vehicle, or the like. The camera mounted in a vehicle can be, for example, used as input to a control device in order to achieve safe driving of a vehicle. Alternatively, the camera mounted in a vehicle can be used for assistance of an operator in order to achieve safe driving of a vehicle.

What is claimed is:

1. An imaging device comprising:
    a photoelectric converter that converts incident light into an electric charge;
    a transfer transistor;
    a first node coupled to the photoelectric converter via the transfer transistor;
    a first signal detection transistor having a gate coupled to the first node;
    a second signal detection transistor having a gate coupled to the photoelectric converter;
    a signal line coupled to one of a source and a drain of the first signal detection transistor but not through either a gate or the other of the source and the drain of the first signal detection transistor, a signal corresponding to an electric potential of the first node being transmitted through the signal line;
    a first transistor one of a source and a drain of which is coupled to the first node; and
    a second transistor one of a source and a drain of which is coupled to the photoelectric converter, wherein
    the one of the source and the drain of the first signal detection transistor is coupled to the other of the source and drain of the first transistor but not through either the gate or the other of the source and the drain of the first signal detection transistor,
    one of a source and a drain of the second signal detection transistor is coupled to the other of the source and drain of the second transistor, and
    no transistor is coupled between the photoelectric converter and the gate of the second signal detection transistor.

2. The imaging device according to claim 1, wherein
    at least a part of a signal output by the first signal detection transistor is fed back to the other of the source and drain of the first transistor; and
    at least a part of a signal output by the second signal detection transistor is fed back to the other of the source and drain of the second transistor.

3. The imaging device according to claim 1, further comprising:
    a third transistor coupled between the one of the source and drain of the first signal detection transistor and the other of the source and drain of the first transistor;
    a first capacitor having a first end and a second end, the first end being coupled to the first node, the second end being coupled to the other of the source and drain of the first transistor; and
    a second capacitor having a third end and a fourth end, the third end being coupled to a node between the first transistor and the third transistor.

4. The imaging device according to claim 1, further comprising:
    a third transistor one of a source and a drain of which is coupled to the one of the source and drain of the first signal detection transistor;
    a first capacitor having a first end and a second end, the first end being coupled to the first node, the second end being coupled to the other of the source and the drain of the third transistor; and
    a second capacitor having a third end and a fourth end, the third end being coupled to a node between the third transistor and the first capacitor.

5. The imaging device according to claim 1, further comprising a buffer circuit coupled between the transfer transistor and the one of the source and the drain of the second transistor.

6. The imaging device according to claim 1, wherein the one of the source and the drain of the second signal detection transistor is coupled to the signal line.

7. The imaging device according to claim 1, further comprising a power line couple to the other of the source and the drain of the first signal detection transistor, at least two different voltages being selectively applied to the power line.

8. The imaging device according to claim 7, wherein the other of the source and the drain of the second signal detection transistor is coupled to the power line.

9. The imaging device according to claim 1, wherein
    the one of the source and the drain of the second signal detection transistor is coupled to the signal line but not through either the gate or the other of the source and the drain of the second signal detection transistor, and
    the one of the source and the drain of the second signal detection transistor is coupled to the other of the source and drain of the second transistor but not through either the gate or the other of the source and the drain of the second signal detection transistor.

10. The imaging device according to claim 1, wherein
    the photoelectric converter includes a first electrode, a second electrode, and a photoelectric conversion layer that is sandwiched between the first electrode and the second electrode.

11. The imaging device according to claim 1, wherein the imaging device performs a global shutter operation.

12. An imaging device comprising:
a photoelectric converter that converts incident light into an electric charge;
a transfer transistor;
a first signal detection transistor having a first gate coupled to the photoelectric converter via a first node, the transfer transistor and a second node in this order;
a second signal detection transistor having a second gate coupled to the second node;
a first feedback circuit that feeds back at least a part of an output of the first signal detection transistor to the first node; and
a second feedback circuit that feeds back at least a part of an output of the second signal detection transistor to the second node.

13. The imaging device according to claim 12, further comprising a signal line coupled to one of a source and a drain of the first signal detection transistor, a signal corresponding to an electric potential of the first node being transmitted through the signal line.

14. The imaging device according to claim 13, wherein one of a source and a drain of the second signal detection transistor is coupled to the signal line.

15. The imaging device according to claim 12, wherein the imaging device performs a global shutter operation.

16. An imaging device comprising:
a photoelectric converter that converts light into an electric charge;
a first transfer transistor;
a first node coupled to the photoelectric converter via the first transfer transistor;
a first signal detection transistor having a gate coupled to the first node;
a signal line coupled to one of a source and a drain of the first signal detection transistor but not through either a gate or the other of the source and the drain of the first signal detection transistor, a signal corresponding to an electric potential of the first-node being transmitted through the signal line;
a first transistor one of a source and a drain of which is coupled to the first node; and
a second transistor one of a source and a drain of which is coupled to the photoelectric converter, wherein
the one of the source and the drain of the first signal detection transistor is coupled to the other of the source and the drain of the first transistor and the other of the source and drain of the second transistor but not through either the gate or the other of the source and the drain of the first signal detection transistor, and
no transfer transistor other than the first transfer transistor is directly coupled to the first transfer transistor between the photoelectric converter and the gate of the first signal detection transistor.

17. The imaging device according to claim 16, wherein the imaging device performs a global shutter operation.

* * * * *